(12) United States Patent
Kudo

(10) Patent No.: US 12,096,612 B2
(45) Date of Patent: Sep. 17, 2024

(54) SEMICONDUCTOR DEVICE HAVING SiGe LAYER ON Si PILLAR

(71) Applicant: Micron Technology, Inc., Boise, ID (US)

(72) Inventor: Tomohiko Kudo, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 234 days.

(21) Appl. No.: 17/369,899

(22) Filed: Jul. 7, 2021

(65) Prior Publication Data

US 2023/0011948 A1    Jan. 12, 2023

(51) Int. Cl.
*H10B 12/00* (2023.01)
*H01L 29/45* (2006.01)

(52) U.S. Cl.
CPC ........... *H10B 12/34* (2023.02); *H01L 29/456* (2013.01); *H10B 12/0335* (2023.02); *H10B 12/053* (2023.02); *H10B 12/315* (2023.02); *H10B 12/485* (2023.02)

(58) Field of Classification Search
None
See application file for complete search history.

(56) References Cited

U.S. PATENT DOCUMENTS

| | | | |
|---|---|---|---|
| 2018/0158826 A1* | 6/2018 | Cho | H10B 12/34 |
| 2022/0051700 A1* | 2/2022 | Lee | G11C 5/063 |
| 2022/0139790 A1* | 5/2022 | Yang | H10B 12/0335 257/48 |

* cited by examiner

*Primary Examiner* — Steven M Christopher
(74) *Attorney, Agent, or Firm* — Dorsey & Whitney LLP

(57) ABSTRACT

Disclosed herein is a method that includes epitaxially growing SiGe layer on a silicon substrate, etching the SiGe layer and the silicon substrate to form an active region covered with the SiGe layer, first etching the SiGe layer formed on a first region of the active region without etching the SiGe layer formed on a second region of the active region to form a first trench, and second etching the SiGe layer remaining on an inner wall of the first trench.

10 Claims, 24 Drawing Sheets

SEMICONDUCTOR DEVICE HAVING SiGe LAYER ON Si PILLAR

BACKGROUND

A cell capacitor and a bit line of a DRAM are connected to source/drain regions of a cell transistor via a cell contact plug and a bit-line contact plug, respectively. An example of a method of enlarging a contact margin between the cell contact plug and the source/drain region of the cell transistor is a method of increasing the plane size of each silicon pillar in which the cell transistor is formed without increasing the arrangement pitch of silicon pillars. However, when the plane size of each silicon pillar is increased without increasing the arrangement pitch of silicon pillars, there is a risk that a bit-line contact plug of a certain silicon pillar comes into contact with a cell contact plug of its adjacent silicon pillar.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined wife one or more other disclosed embodiments to form new embodiments.

Figure 1A:
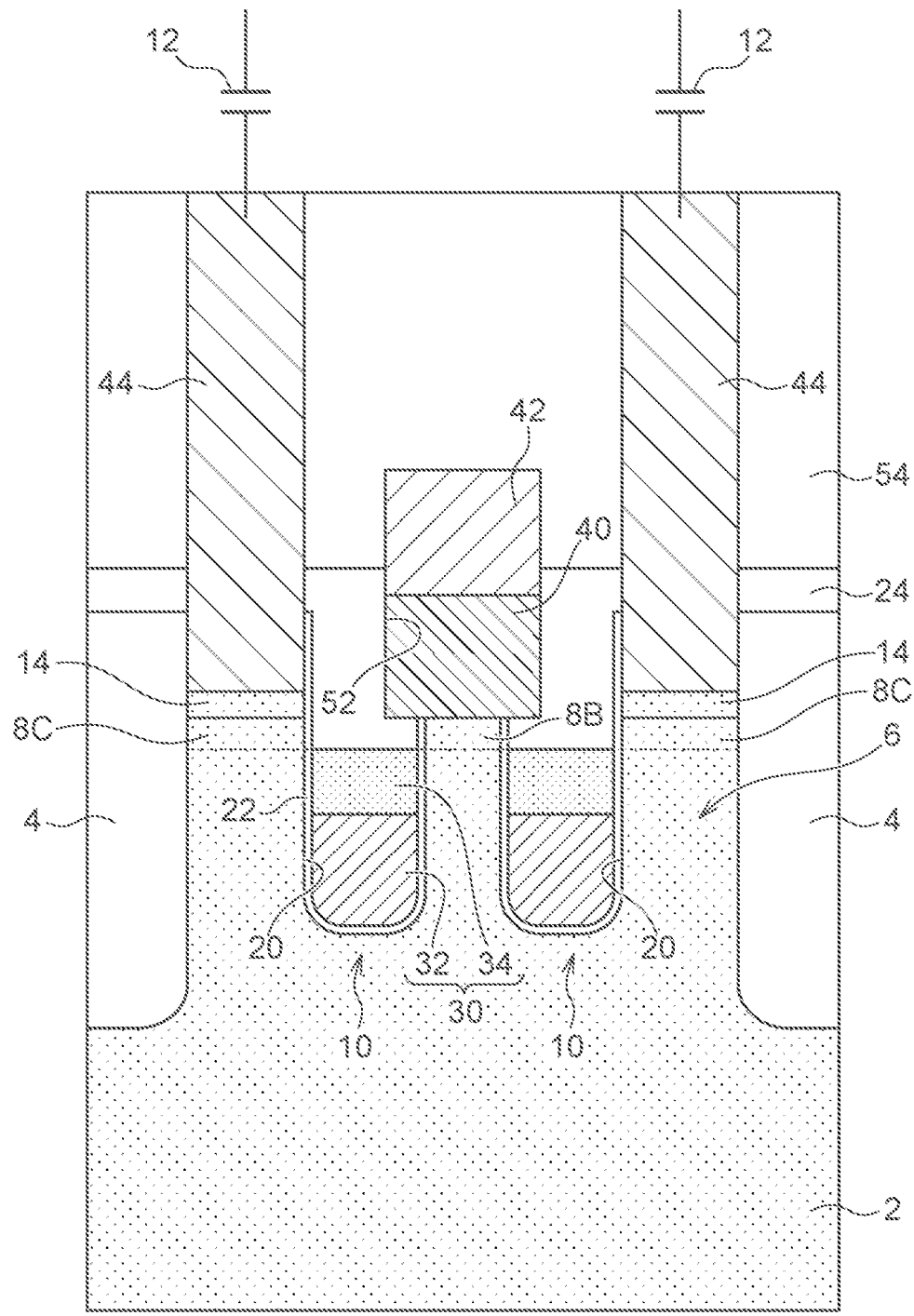
FIG. 1A is a schematic cross-section of a semiconductor device according to the present disclosure, corresponding to a line A-A respectively shown in FIG. 3A to FIG. 10A.
Figure 1B:
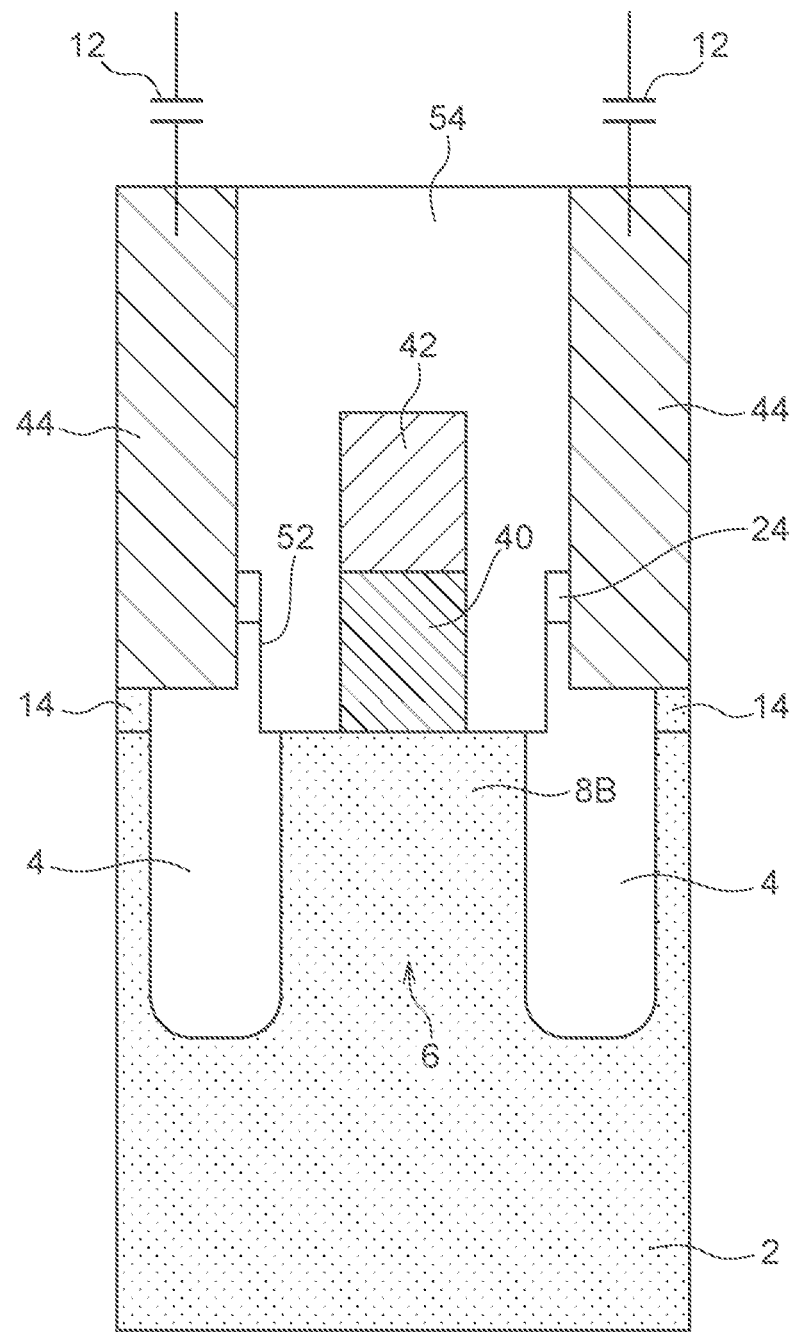
FIG. 1B is a schematic cross-section of the semiconductor device according to the present disclosure, corresponding to a line B-B respectively shown in FIG. 3A to FIG. 10A.

FIG. 1A is a schematic cross-section of a semiconductor device according to the present disclosure. FIG. 1B is a schematic cross-section of the semiconductor device according to the present disclosure. A semiconductor device according to the present disclosure is a semiconductor memory device such as a DRAM, and includes a memory cell transistor 10 and a cell capacitor 12 as shown in FIG. 1A. The memory cell transistor 10 is formed in an active region 6 of a silicon substrate 2 divided by a STI region 4. The active region 6 is made of p-type monocrystalline silicon. Two gate trenches 20 are provided in the active region 6. The inner wall of each gate trench 20 is covered by a gate insulation film 22 made of silicon oxide. A gate electrode 30 is embedded in each gate trench 20 on the gate insulation film 22. The gate electrode 30 includes a lower gate electrode 32 located in a lower portion of the gate trench 20 and an upper gate electrode 34 located on the lower gate electrode 32. The lower gate electrode 32 is made of a conductive material having a large work function, for example, titanium nitride or tungsten. The upper gate electrode 34 is made of a conductive material having a smaller work function than that of the lower gate electrode 32, for example, polysilicon. The top of the gate electrode 30 is covered by a gate-cap insulation film 24 made of silicon oxide or silicon nitride, for example.

A region of the active region 6, which is at a higher level than the gate electrode 30, functions as source/drain regions 8B and 8C. The source/drain regions 8B and 8C are made of n-type monocrystalline silicon. The source/drain region 8B is connected to a bit line 42 via a bit-line contact 40. The source/drain region 8C is connected to the cell capacitor 12 via a cell contact 44. Whereas the bit-line contact 40 is in direct contact with the source/drain region 8B without a SiGe layer 14, the SiGe layer 14 intervenes between the cell contact 44 and the source/drain region 8C. That is, the SiGe layer 14 is sandwiched between the source/drain region 8C and the cell contact 44. The SiGe layer 14 is directly coupled to the source/drain region 8C and the cell contact 44. The bit-line contact 40 is embedded in a trench 52 provided in the active region 6 and the gate-cap insulation film 24. The bit-line contact 40 partly overlaps the gate electrode 30. The cell contact 44 is embedded in an insulation film 54. As shown in FIG. 1B, the plane position of the trench 52 partly overlaps the STI region 4. Therefore, the STI region 4 is exposed from a portion of the inner wall of the trench 52.

Next, a manufacturing method of a semiconductor device according to the present embodiment is described.

Figure 2:
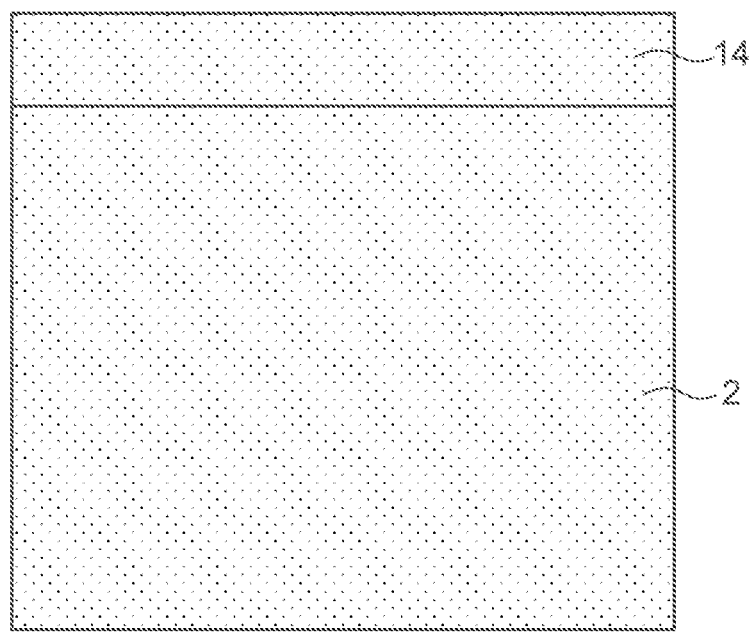
FIG. 2 is a schematic cross-section for explaining a manufacturing process of the semiconductor device according to the present disclosure.
Figure 3A:
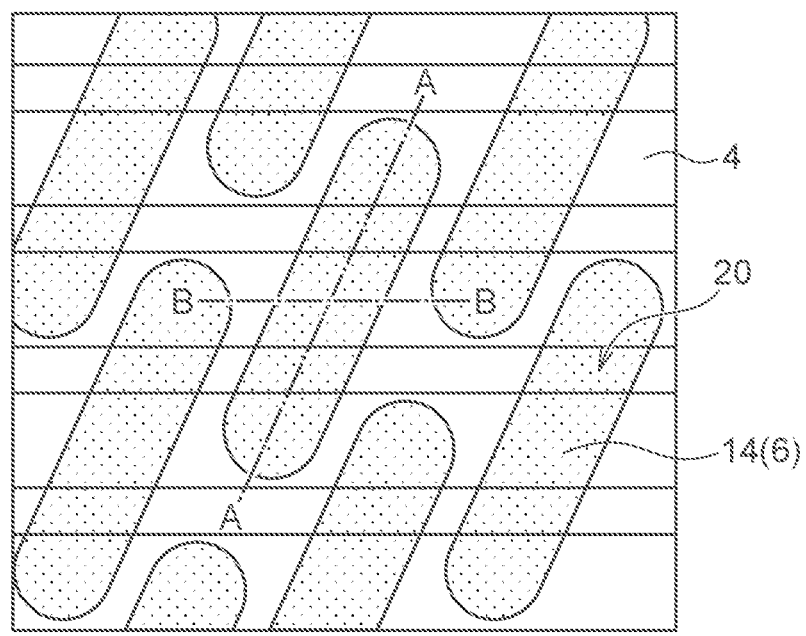
FIG. 3A is a partial schematic plan view for explaining the manufacturing process of the semiconductor device according to the present disclosure.
Figure 3B:
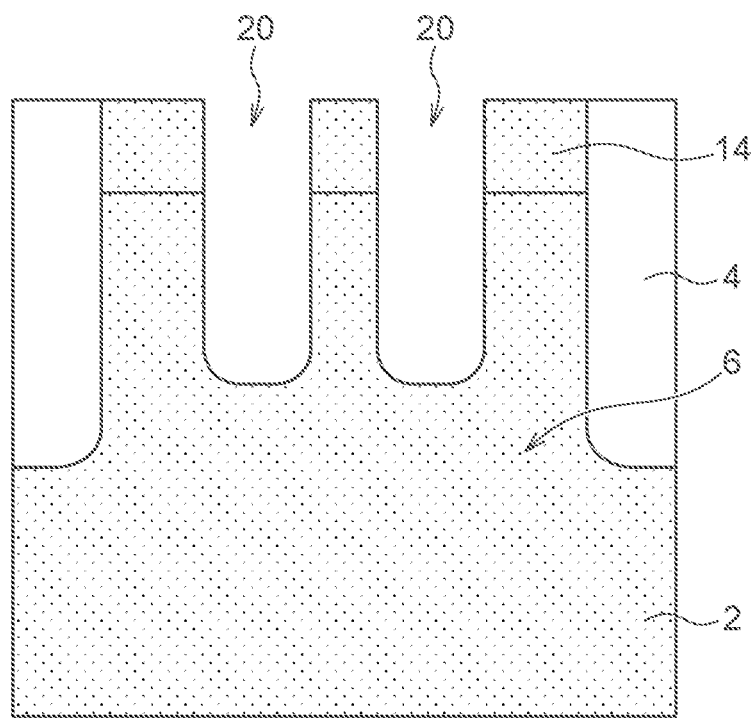
FIG. 3B is a schematic cross-section along the line A-A respectively shown in FIG. 3A.
Figure 4A:
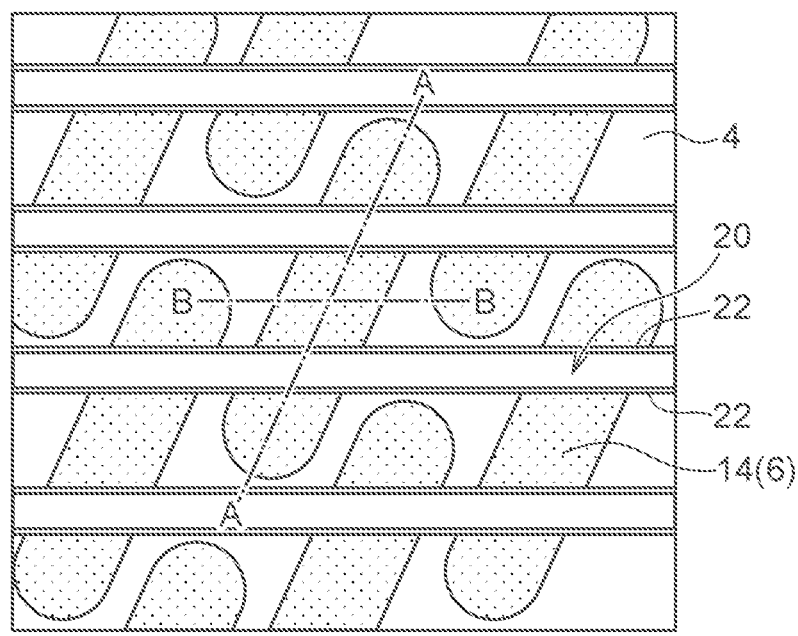
FIG. 4A is a partial schematic plan view for explaining the manufacturing process of the semiconductor device according to the present disclosure.
Figure 4B:
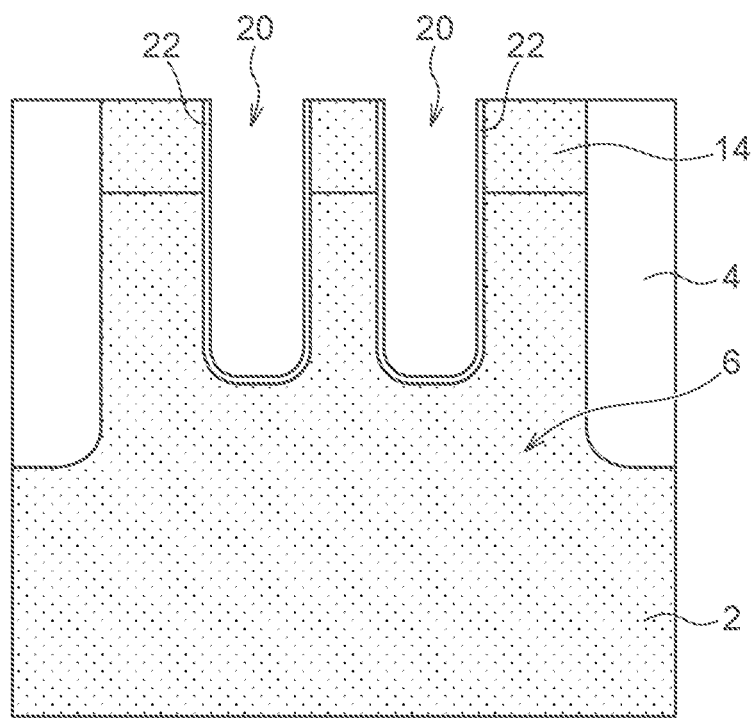
FIG. 4B is a schematic cross-section along the line A-A respectively shown in FIG. 4A.
Figure 5A:
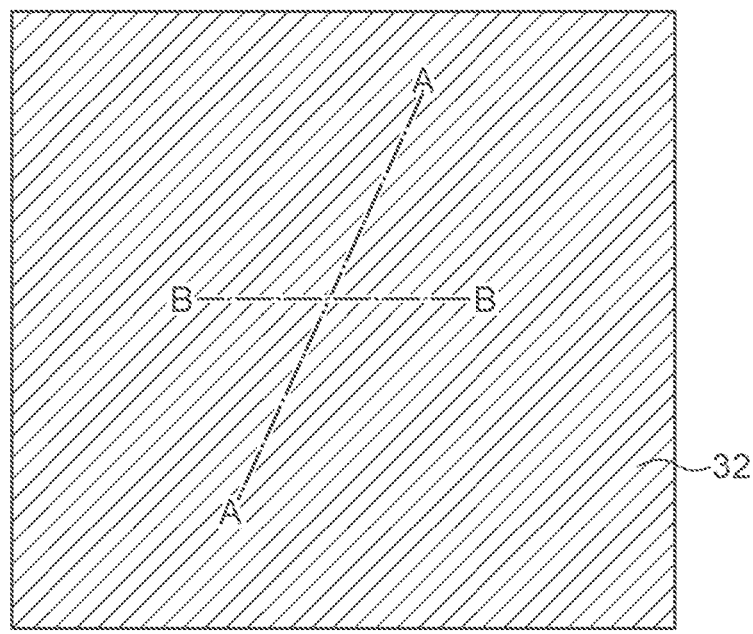
FIG. 5A is a partial schematic plan view for explaining the manufacturing process of the semiconductor device according to the present disclosure.
Figure 5B:
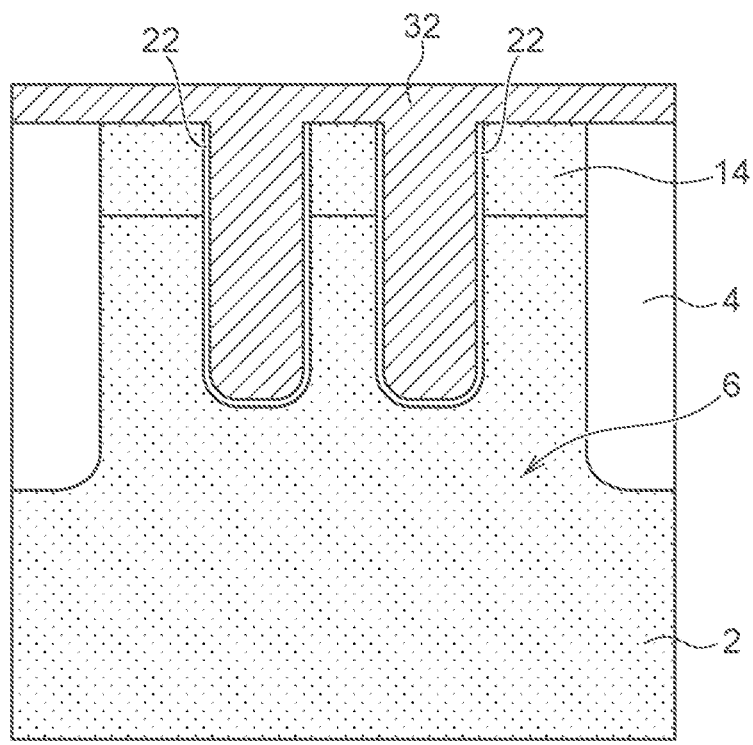
FIG. 5B is a schematic cross-section along the line A-A respectively shown in FIG. 5A.
Figure 6A:
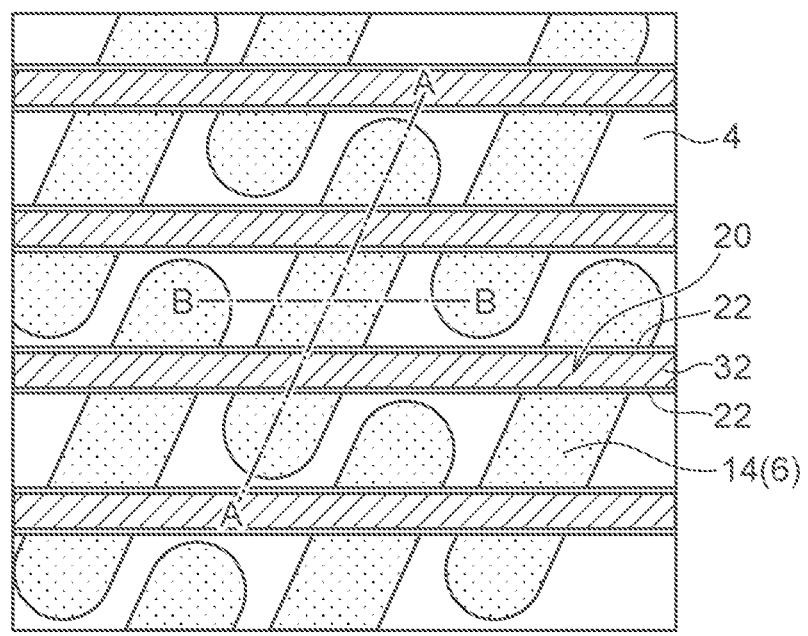
FIG. 6A is a partial schematic plan view for explaining the manufacturing process of the semiconductor device according to the present disclosure.
Figure 6B:
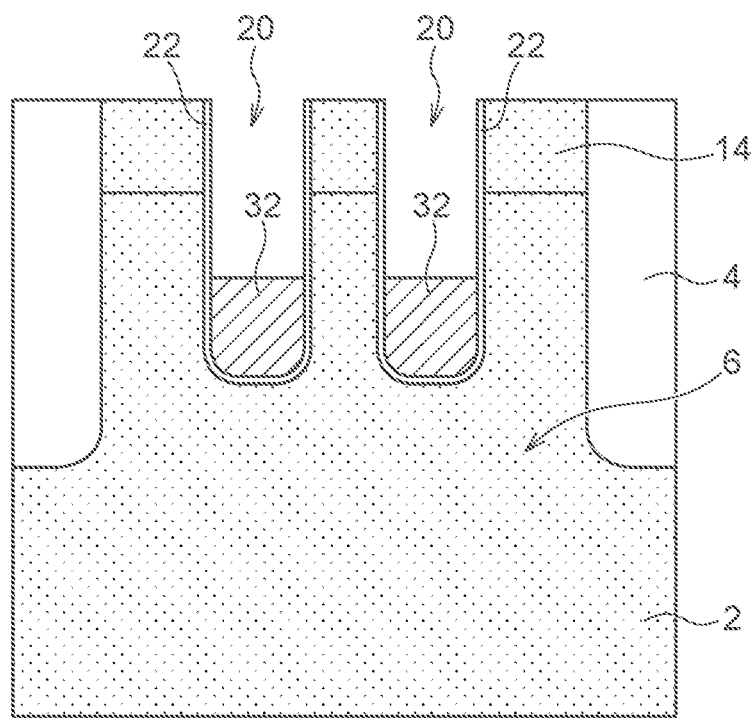
FIG. 6B is a schematic cross-section along the line A-A respectively shown in FIG. 6A.
Figure 7A:
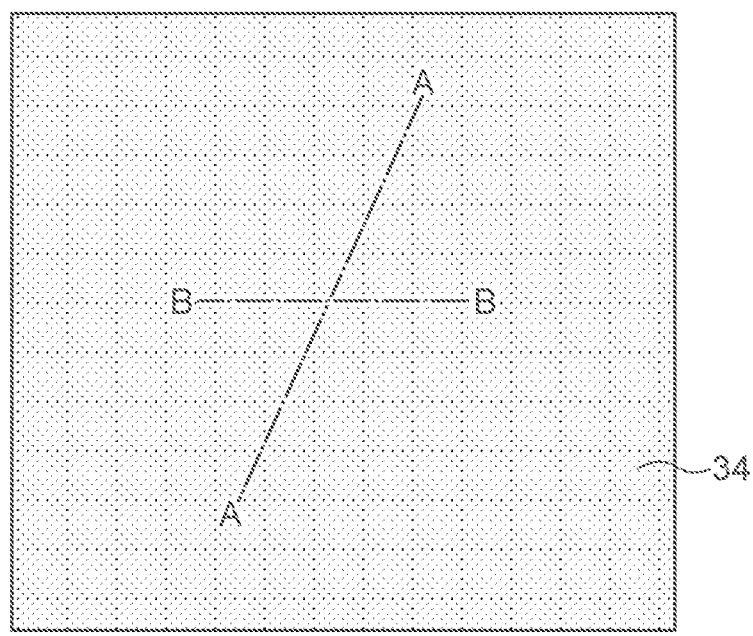
FIG. 7A is a partial schematic plan view for explaining the manufacturing process of the semiconductor device according to the present disclosure.
Figure 7B:
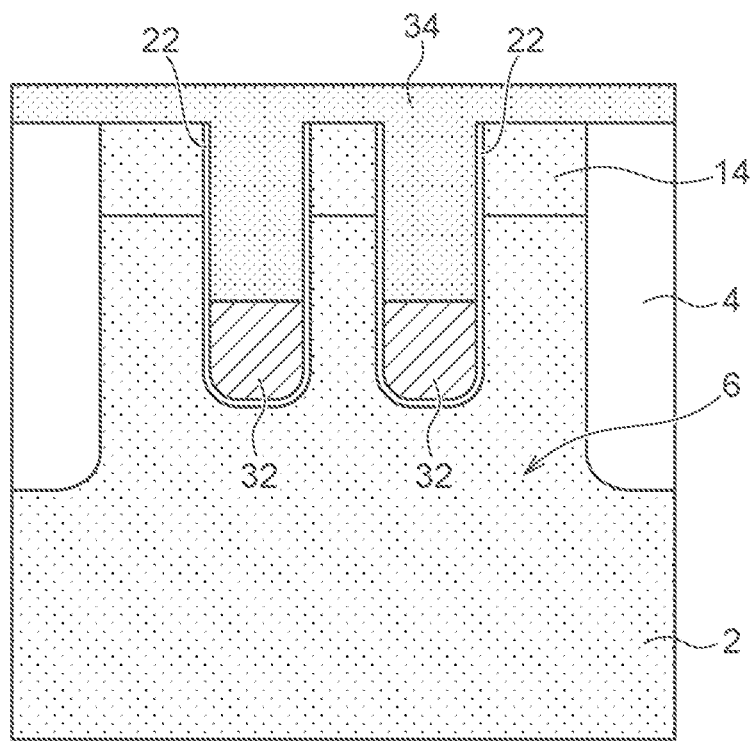
FIG. 7B is a schematic cross-section along the line A-A respectively shown in FIG. 7A.
Figure 8A:
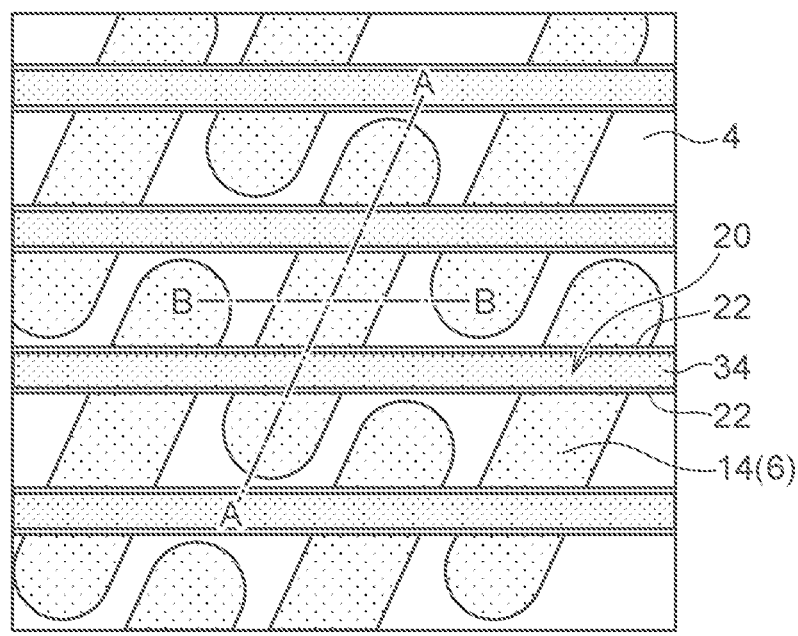
FIG. 8A is a partial schematic plan view tor explaining the manufacturing process of the semiconductor device according to the present disclosure.
Figure 8B:
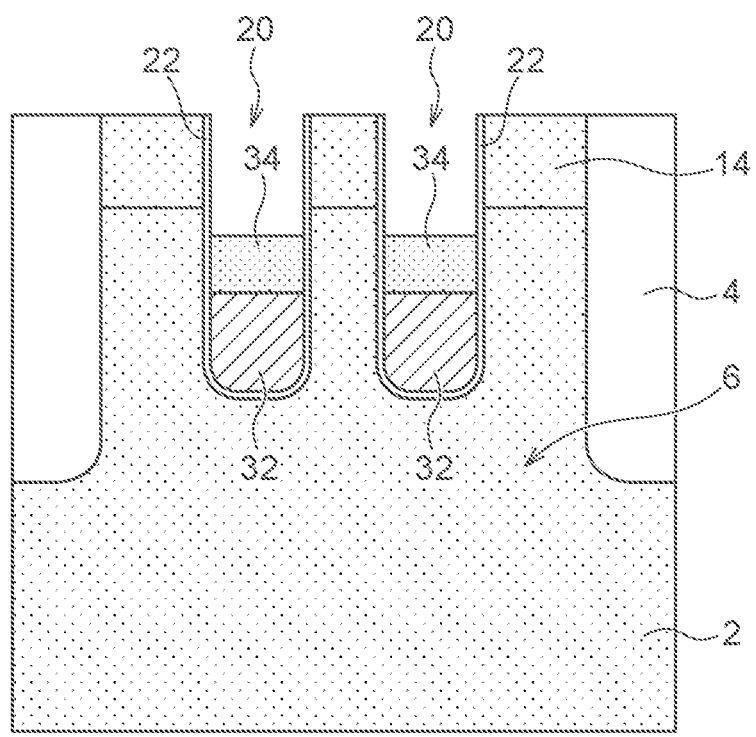
FIG. 8B is a schematic cross-section along the line A-A respectively shown in FIG. 8A.

First, as shown in FIG. 2, the SiGe layer 14 is epitaxially grown on a surface of the silicon substrate 2. Next, as shown in FIGS. 3A and 3B, the STI region 4 is formed in the silicon substrate 2. A region surrounded by the STI region 4 is the active region 6. The active region 6 is in a form of pillars, and a surface thereof is covered by the SiGe layer 14. Next, the gate trenches 20 are formed in the silicon substrate 2 and the STI region 4. Two gate trenches 20 are assigned to one active region 6. Next, as shown in FIGS. 4A and 4B, thermal oxidation is performed, thereby forming the gate insulation film 22 on the inner wall of each gate trench 20. Next, as shown in FIGS. 5A and 5B, the lower gate electrode 32, for example, made of titanium nitride or tungsten is deposited on the entire surface to embed the gate trenches 20. Next, as shown in FIGS. 6A and 6B, the lower gate electrode 32 is etched back. Accordingly, the lower gate electrode 32 remains on the bottom of each gate trench 20. Next, as shown in FIGS. 7A and 7B, the upper gate electrode 34, for example, made of polysilicon is deposited on the entire surface to embed the gate trenches 20. Next, as shown in FIGS. 8A and 8B, the upper gate electrode 34 is etched back. Accordingly, the upper gate electrode 34 remains on the lower gate electrode 32 in each gate trench 20.

Figure 9A:
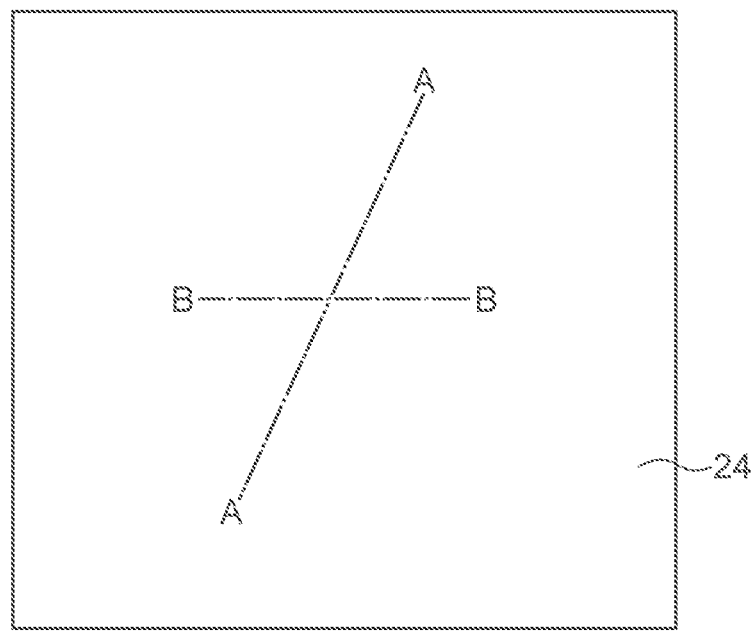
FIG. 9A is a partial schematic plan view for explaining the manufacturing process of the semiconductor device according to the present disclosure.
Figure 9B:
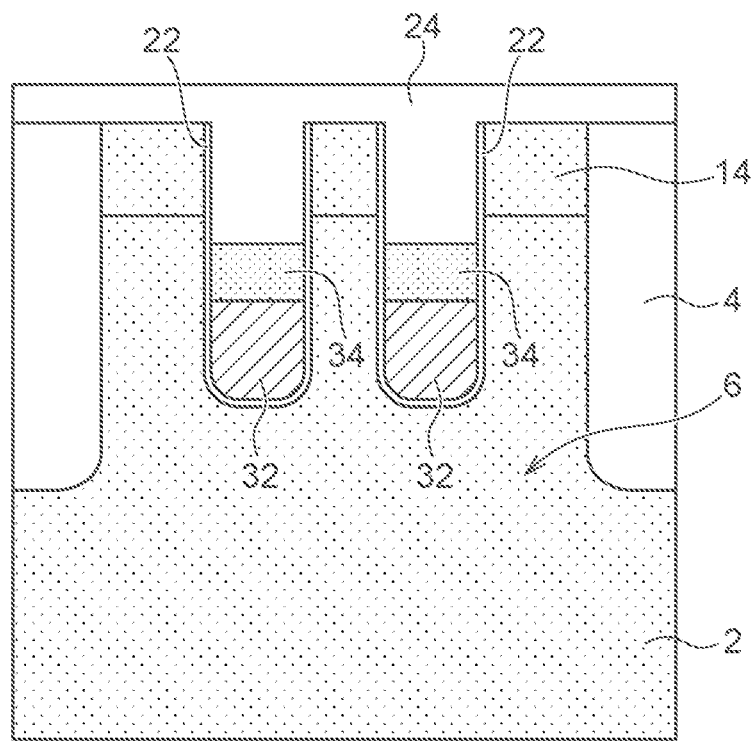
FIG. 9B is a schematic cross-section along the line A-A respectively shown in FIG. 9A.
Figure 10A:
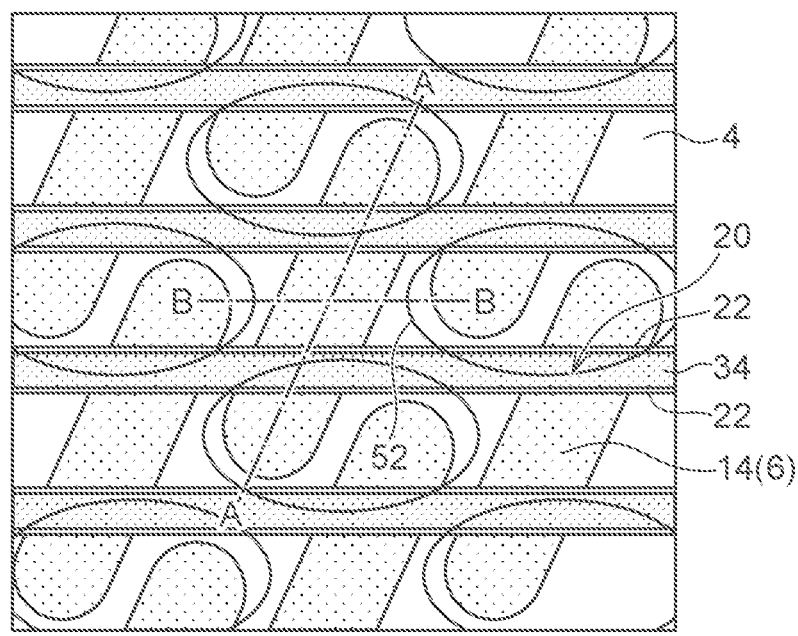
FIG. 10A is a partial schematic plan view for explaining the manufacturing process of the semiconductor device according to the present disclosure.
Figure 10B:
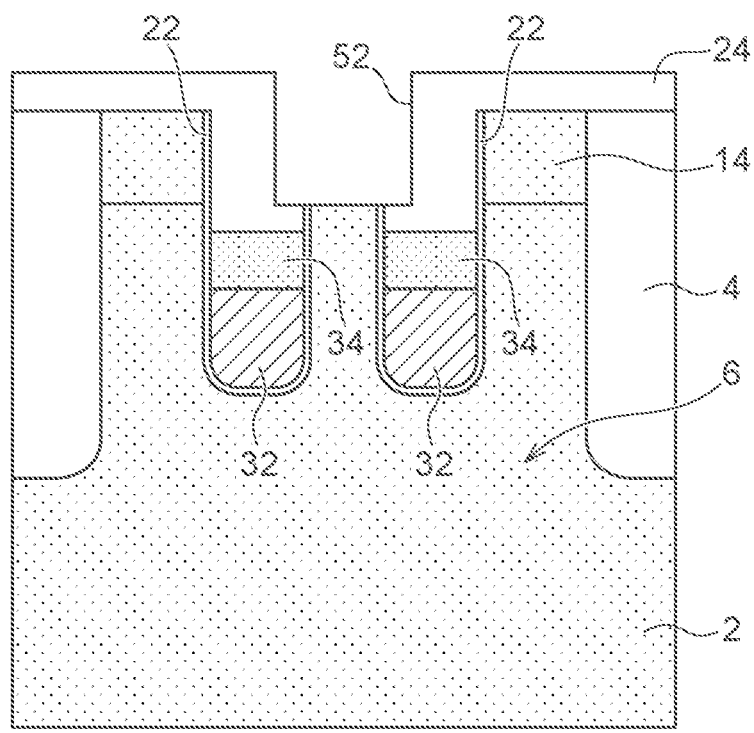
FIG. 10B is a schematic cross-section along the line A-A respectively shown in FIG. 10A.
Figure 10C:
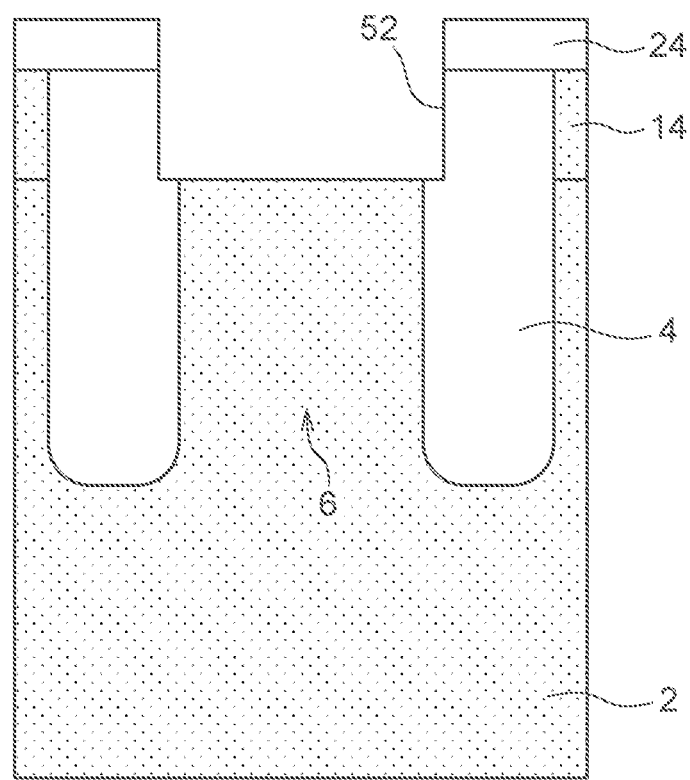
FIGS. 10C, 10D, and 10F are schematic cross-sections along a line B-B shown in FIG. 10A.
Figure 10D:
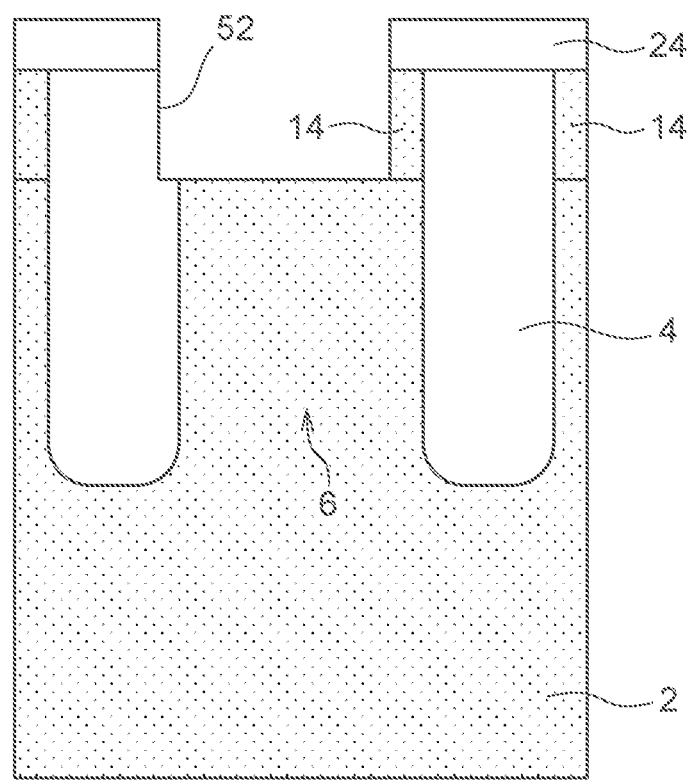
Figure 10E:
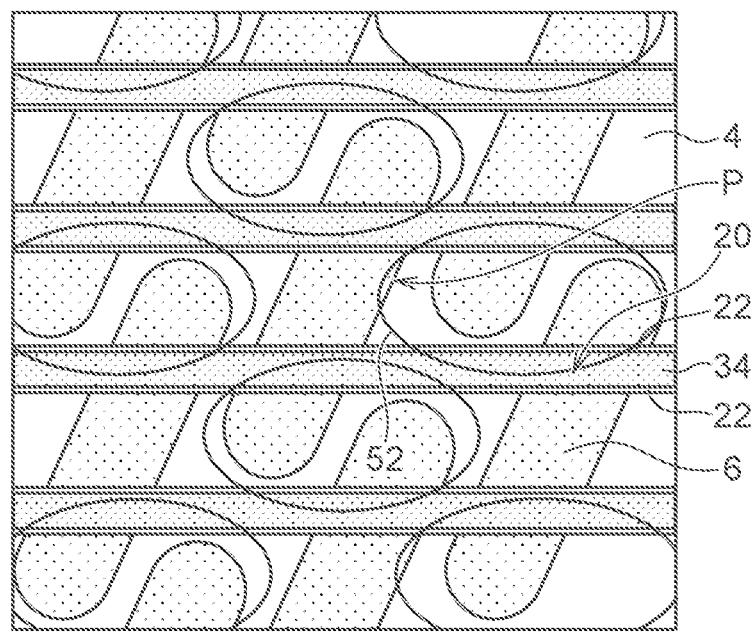
FIG. 10E is a schematic plan view corresponding to FIG. 10D.
Figure 10F:
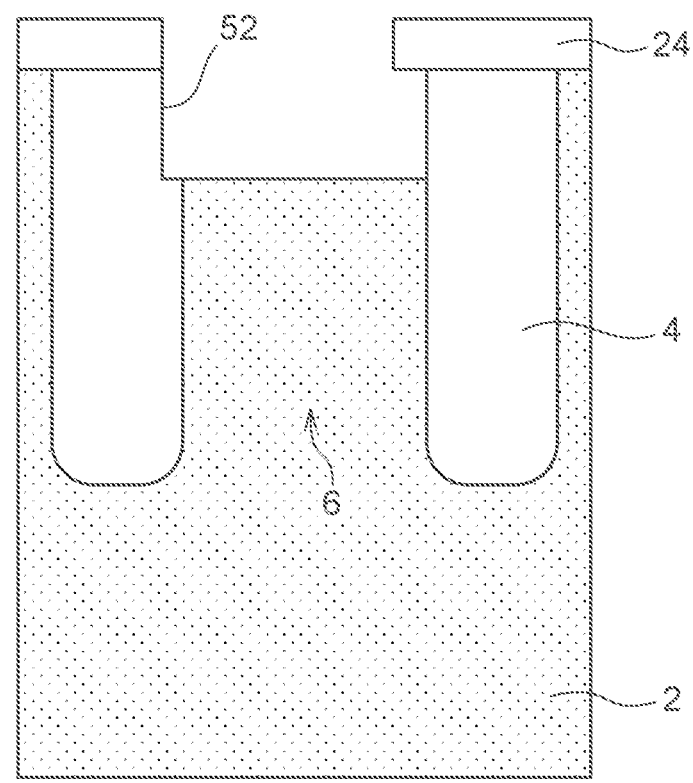

Next, as shown in FIGS. 9A and 9B, the gate-cap insulation film 24, for example, made of silicon nitride is formed on the entire surface to embed the gate trenches 20. Next, as shown in FIGS. 10A and 10B, the trench 52 is formed in a portion of the active region 6 which is to be connected to the bit-line contact 40. In FIG. 10A, the gate-cap insulation film 24 is omitted for the understanding of the drawing. In etching for forming the trench 52, an etching rate of the active region 6 made of silicon and an etching rate of the SiGe layer 14 may be the same as each other. The trench 52 is provided in a center portion of the active region 6, that is, a portion to be connected to the bit-line contact 40. In a section shown in FIG. 10C, it is ideal that the SiGe layer 14 is entirely removed to a predetermined depth region. However, in a case where the size of the active region 6 is large, a portion of the SiGe layer 14 may remain on the inner wall of the trench 52 as shown in FIG. 10D. This phenomenon occurs when overlap occurs between the active region 6 and the remaining portion of the gate-cap insulation film 24 as shown with reference sign P in FIG. 10E. Therefore, this phenomenon can easily occur in a case where the size of the active region 6 is large. Accordingly, in the present embodiment, the SiGe layer 14 is selectively etched, so that the SiGe layer 14 remaining in the trench 52 is removed, as shown in FIG. 10F. This etching is performed under a condition in which an etching rate of the SiGe layer 14 is higher than an etching rate of silicon. Accordingly, it is possible to selectively etch the SiGe layer 14 in the trench 52 without damaging the active region 6.

Figure 11A:
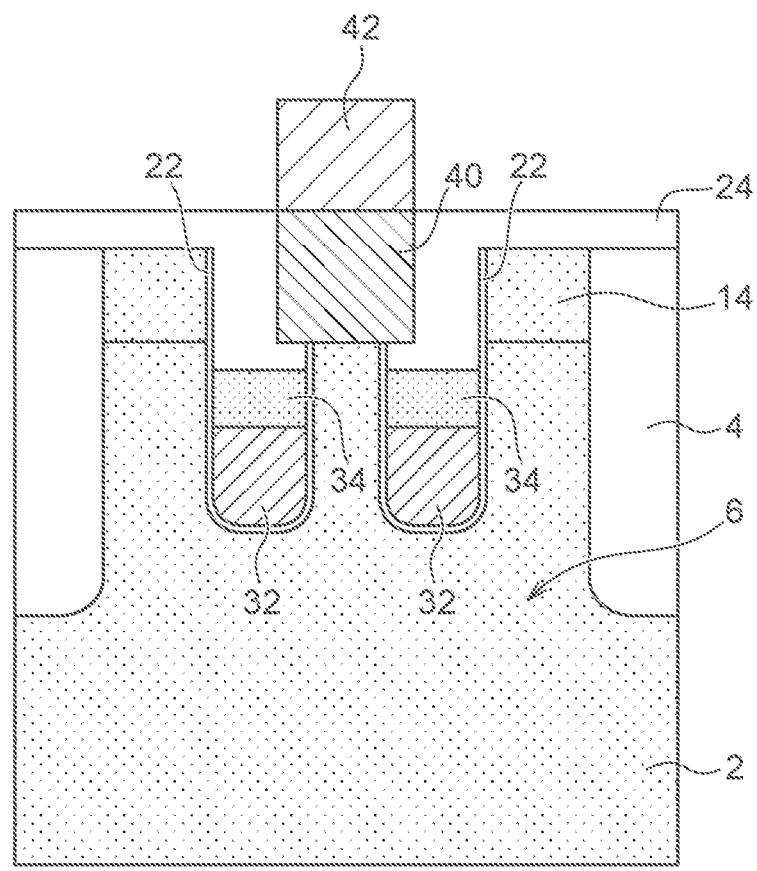
FIG. 11A is a schematic cross-section for explaining the manufacturing process of the semiconductor device accenting to the present disclosure, corresponding to the line A-A respectively shown in FIG. 3A to FIG. 10A.
Figure 11B:
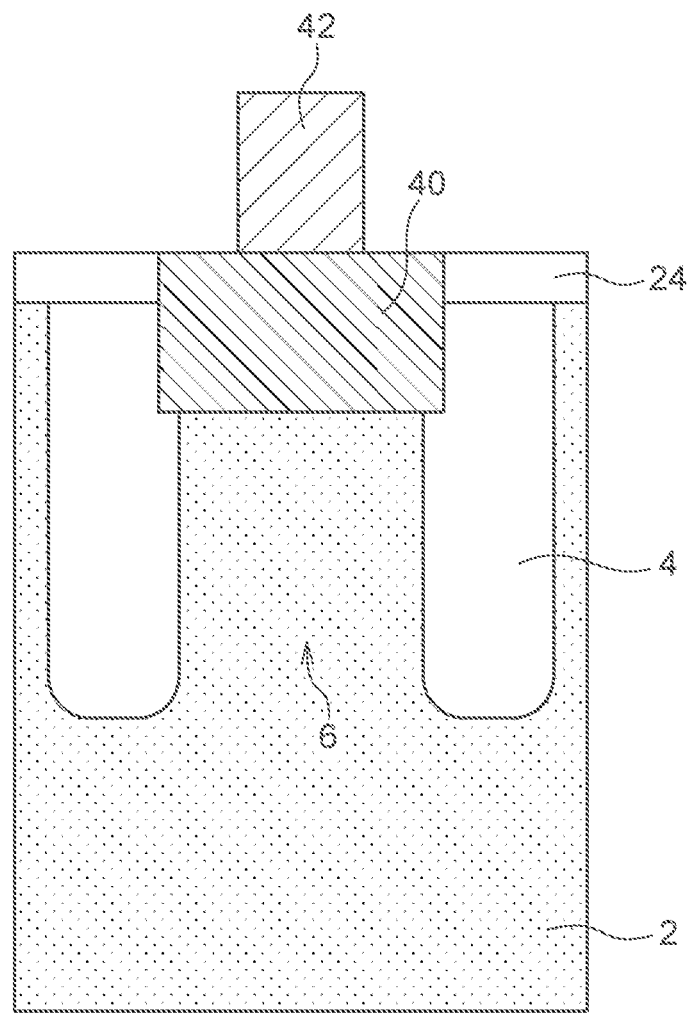
FIGS. 11B, 11C, 12A, and 12B are schematic cross-section for explaining the manufacturing process of the semiconductor device according to the present disclosure, corresponding to the line B-B respectively shown in FIG. 3A to FIG. 10A.
Figure 11C:
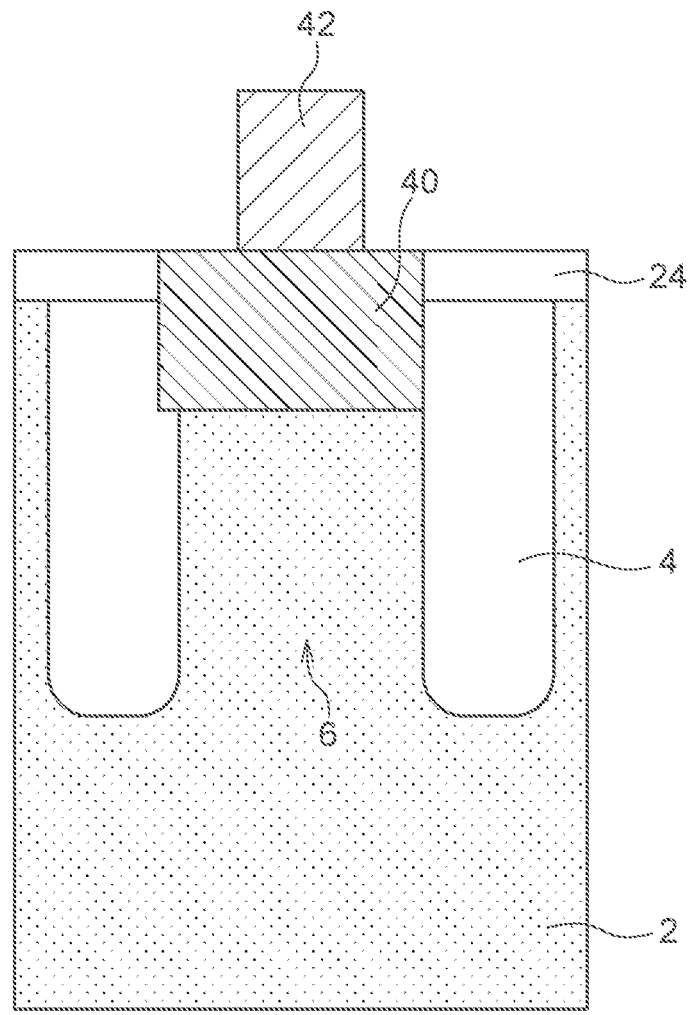
Figure 12A:
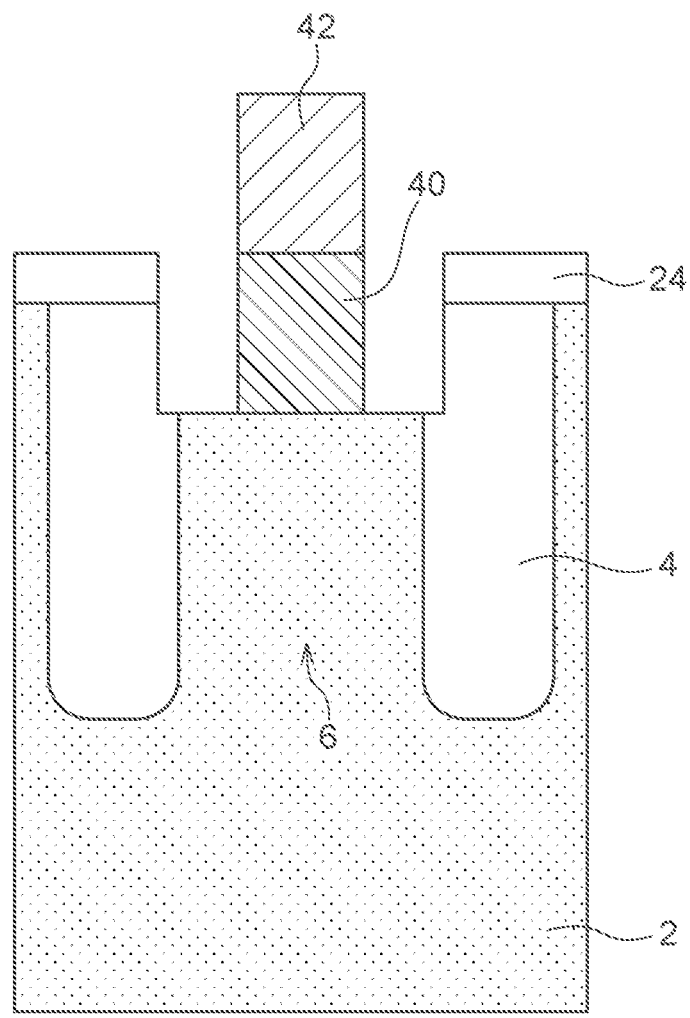
Figure 12B:
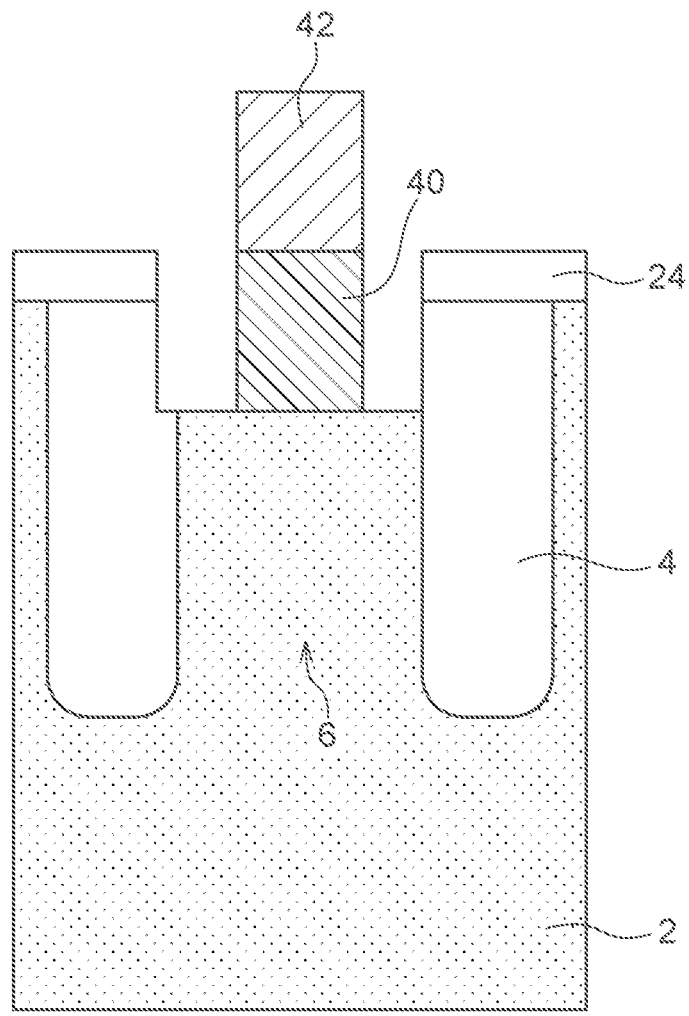
Figure 13:
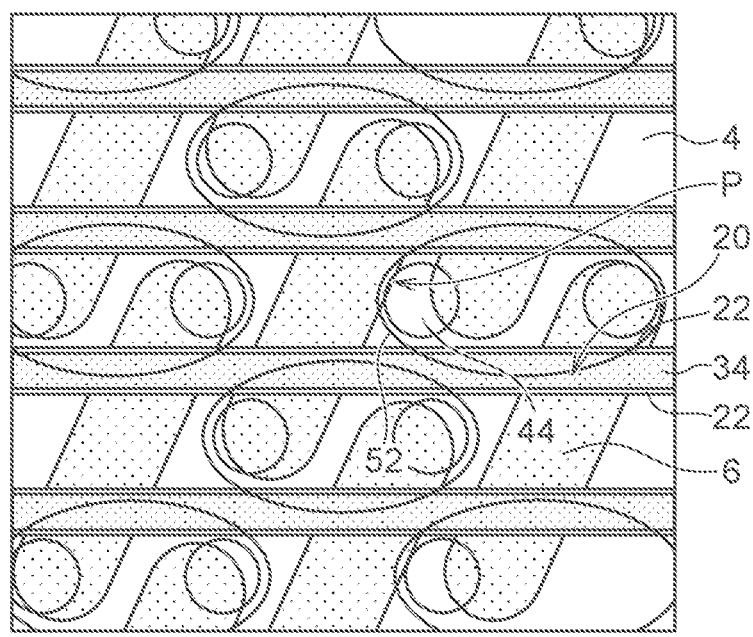
FIG. 13 is a schematic plan view corresponding to FIGS. 1A and 1B.

Next, as shown in FIGS. 11A and 11B, the bit-line contact 40 is embedded in the trench 52, and the bit line 42 is then formed on the bit-line contact 40. Here, even in a case where a portion of the SiGe layer 14 remains on the inner wall of the trench 52 as described with reference to FIG. 10D, the SiGe layer 14 remaining in the trench 52 is removed as shown in FIGS. 10E and 10F, and thus the structure shown in FIG. 11C is obtained. Next, as shown in FIG. 12A, the bit-line contact 40 is etched using the bit line 42 as mask, thereby being separated from its adjacent bit-line contact 40. In a case where the structure before the bit-line contact 40 is etched is the structure shown in FIG. 11C, the structure shown in FIG. 12B is obtained by etching of the bit-line contact 40. Thereafter, the structure obtained in this manner is covered by the insulation film 54 entirely, and then the cell contact 44 and the cell capacitor 12 are formed. Consequently, the structure shown in FIGS. 1A and 1B is obtained. The plane position of the cell contact 44 is shown in FIG. 13. Even in a case where overlap occurs between the active region 6 and the remaining portion of the gate-cap insulation film 24 as shown with reference sign P in FIG. 13, the SiGe layer 14 does not remain at this portion. As described above, according to the manufacturing processes of the present disclosure, the trench 52 for embedding the bit-line contact 40 is formed and thereafter selective etching is performed for the SiGe layer 14. Therefore, even when the SiGe layer 14 remains in the trench 52 as shown in FIG. 10D, the remaining SiGe layer 14 is removed. Accordingly, it is possible to prevent contact between the SiGe layer 14 remaining in the trench 52 and the cell contact 44 with each other.

Figure 14A:
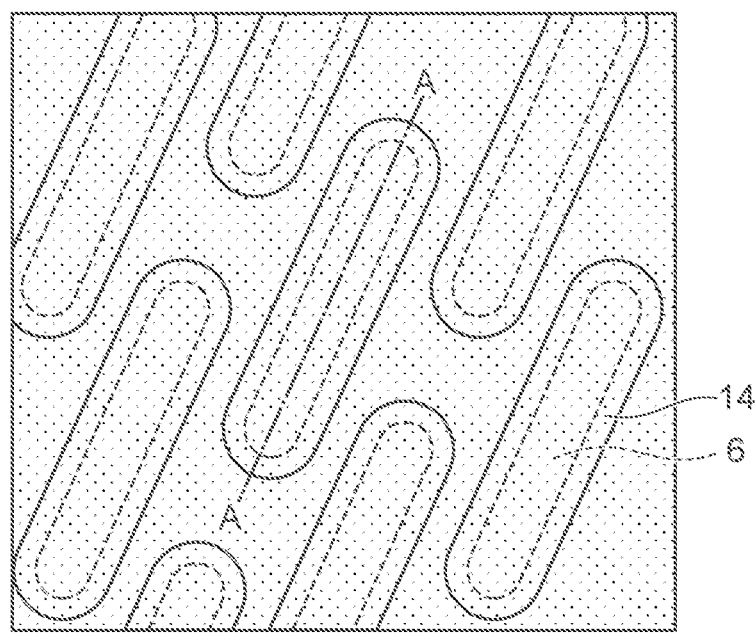
FIGS. 14A and 14C are partial schematic plan views for explaining a manufacturing process of a modification of the semiconductor device according to the present disclosure.
Figure 14B:
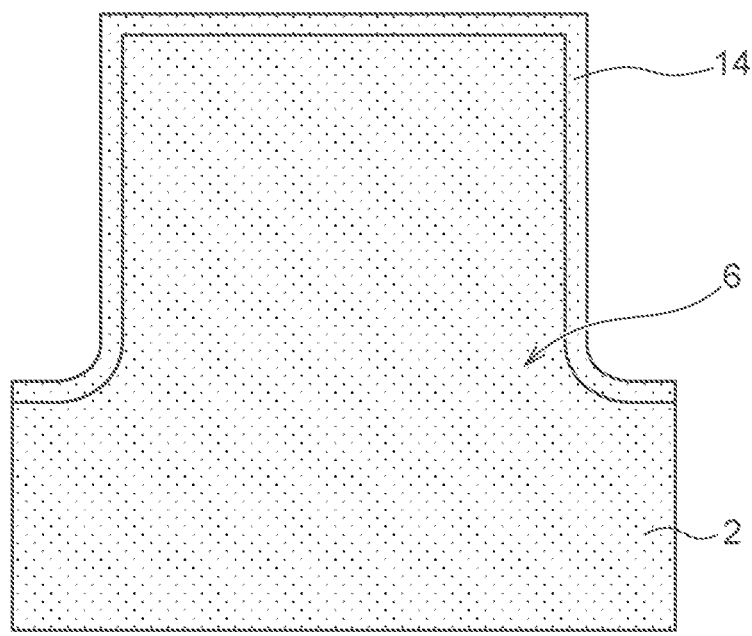
FIGS. 14B and 14D are schematic cross-section along a line A-A respectively shown in FIGS. 14A and 14C.
Figure 14C:
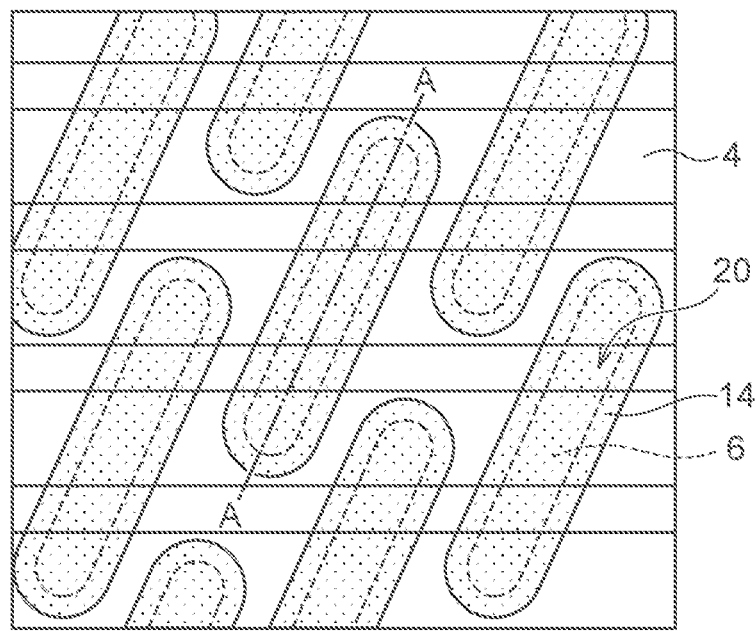
Figure 14D:
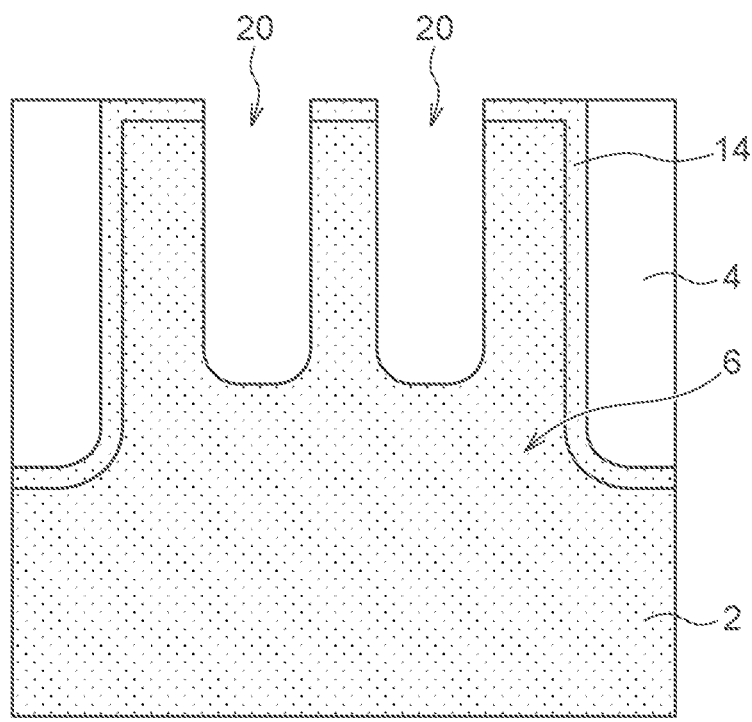
Figure 14E:
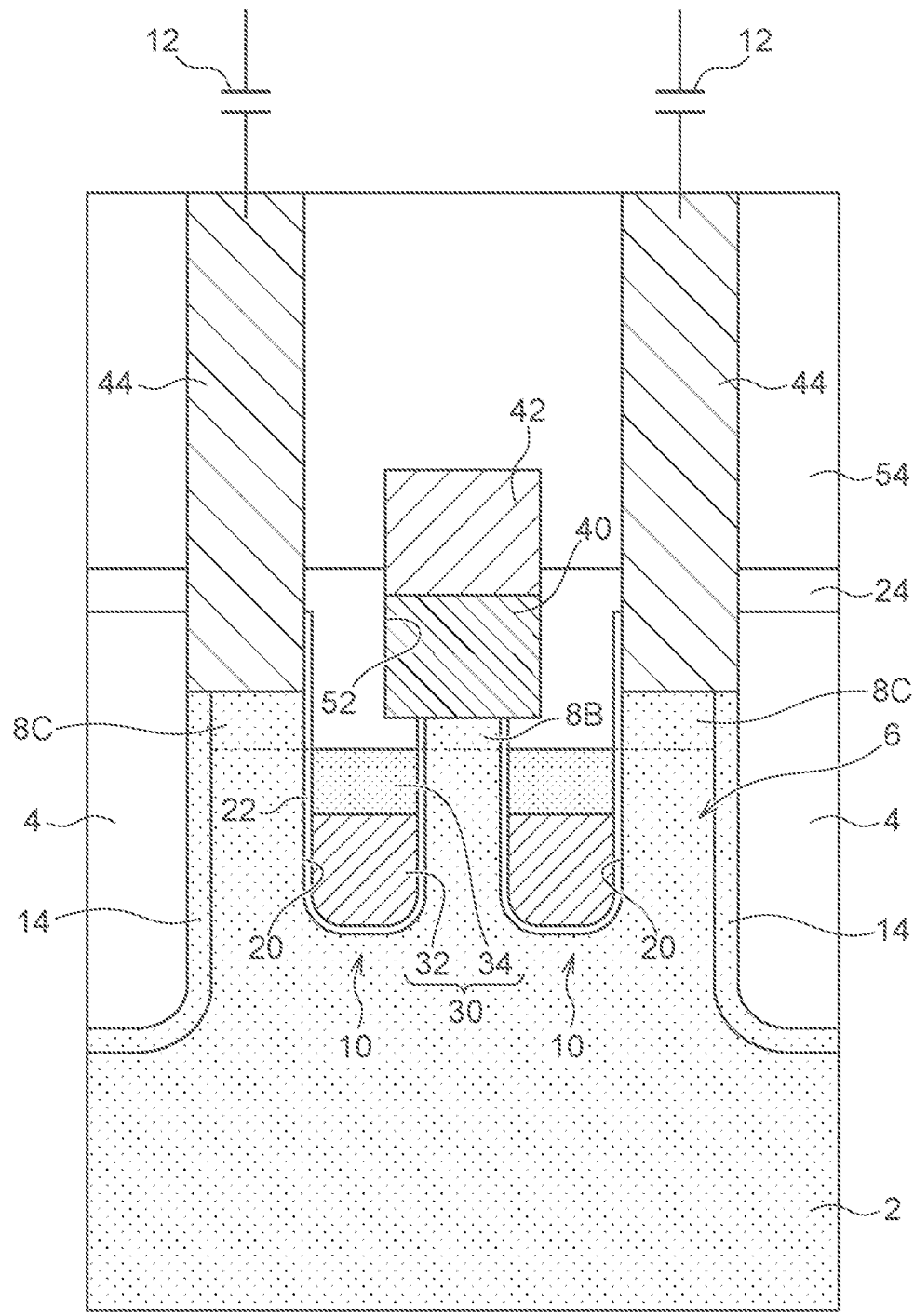
FIG. 14E is a schematic cross-section of a semiconductor device according to a host modification of the present disclosure.
Figure 15:
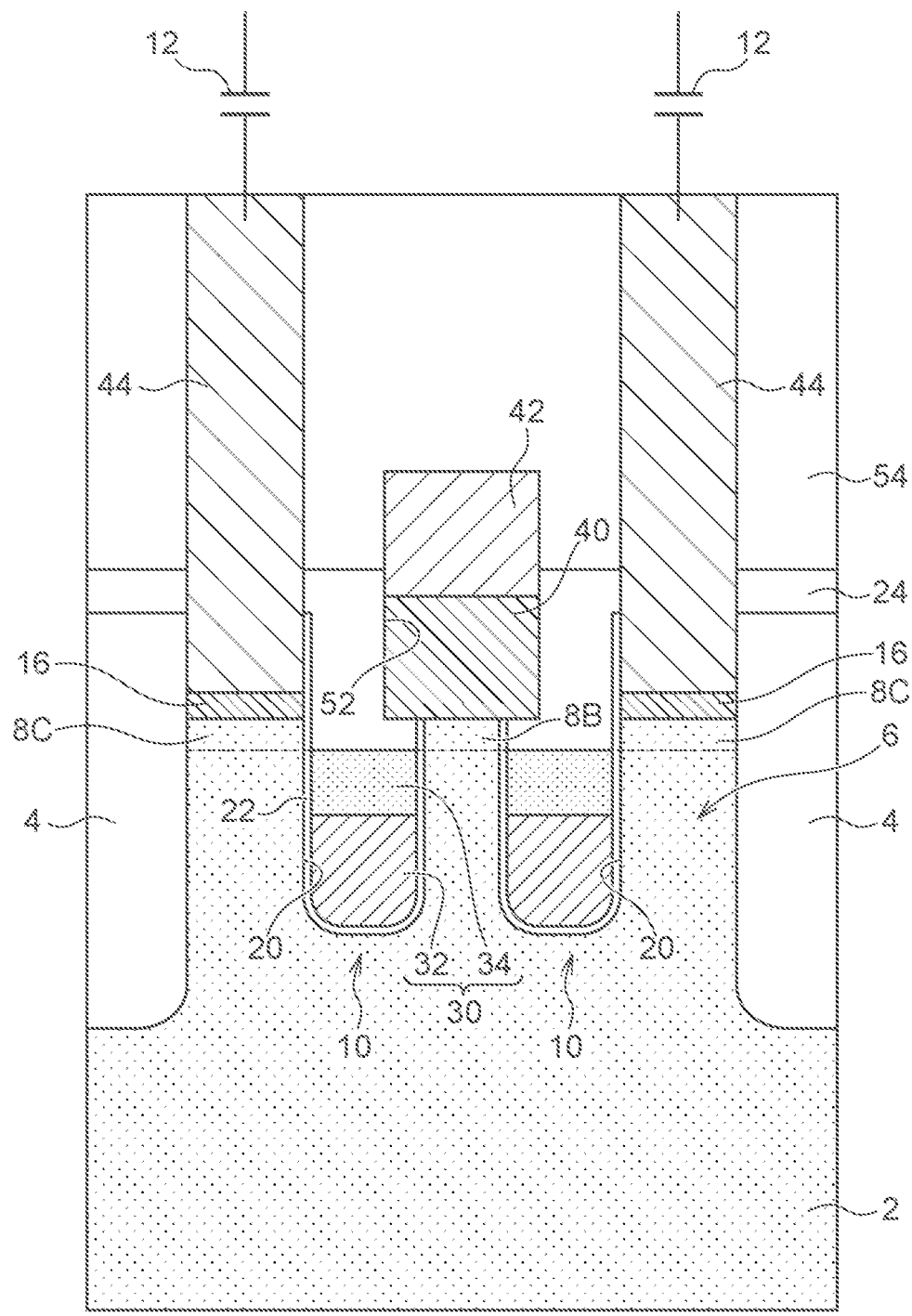
FIG. 15 is a schematic cross-section of a semiconductor device according to a second modification of the present disclosure.

In the example described above, the SiGe layer 14 is epitaxially grown on the silicon substrate 2 and thereafter the SIT region 4 is formed. However, as shown in FIGS. 14A and 14B, the silicon substrate 2 may be processed in a form of pillars without epitaxially growing the SiGe layer 14 on the silicon substrate 2, and thereafter the SiGe layer 14 may be epitaxially grown on a surface of the pillar-shaped active region 6 before formation of the STI region 4. Thereafter, as shown in FIGS. 14C and 14D, the STI region 4 and the gate trenches 20 are formed. Also in this case, it is possible to prevent contact, between the SiGe layer 14 and the cell contact 44 with each other by selectively removing the SiGe layer 14 remaining in the trench 52, as described with reference to FIG. 10D. Accordingly, the final structure shown in FIG. 14E is obtained. In the example shown in FIG. 14E, the SiGe layer 14 covers the boundary between the STI region 4 and the active region 6. Further, as shown in FIG. 15, before formation of the cell contact 44, the SiGe layer 14 remaining on the surface of the active region 6 may be removed and be replaced with a polysilicon layer 16. This structure can eliminate distortion generated at an interface between silicon and the SiGe layer 14.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus, comprising:
an active region surrounded by a STI region;
a bit-line contact plug coupled to a first source/drain region of the active region;
a cell contact plug coupled to a second source/drain region of the active region; and
a SiGe layer directly coupled to the second source/drain region of the active region and the cell contact plug, wherein
the SiGe layer is sandwiched between the active region and the STI region to cover a boundary between the active region and the STI region, the SiGe layer directly contacting the active region and the second source/drain region on one side and directly contacting the STI region on another side.

2. The apparatus of claim 1, wherein the SiGe layer is sandwiched between the second source/drain region of the active region and the second cell contact plug.

3. The apparatus of claim 1, wherein the first source/drain region of the active region and the bit-line contact plug are coupled to each other without interposing the SiGe layer therebetween.

4. The apparatus of claim 3, further comprising a cell capacitor coupled to the cell contact plug.

5. The apparatus of claim 4, further comprising a bit line coupled to the bit-line contact plug.

6. The apparatus of claim 5, further comprising a word line embedded in a gate trench arranged between the first and second source/drain regions of the active region such that the first source/drain region functions as one of source/drain regions of a cell transistor and that the second source/drain region functions as another of the source/drain regions of the cell transistor.

7. The apparatus of claim 6, wherein
the cell contact plug is a first cell contact plug, and the SiGe layer is a first SiGe layer, and
the apparatus further comprises:
a second cell contact plug coupled to a third source/drain region of the active region; and
second SiGe layer arranged between the third source/drain region of the active region and the second contact plug.

8. The apparatus of claim 7, wherein
the cell capacitor is a first cell capacitor, the word line is a first word line, the gate trench is a first gate trench, and the cell transistor is a first transistor; and
the apparatus further comprises:
a second cell capacitor coupled to the second cell contact plug; and
a second word line embedded in a second gate trench arranged between the first and third source/drain regions of the active region such that the first source/drain region functions as one of source/drain regions of a second cell transistor and that the third source/drain region functions as another of the source/drain regions of the second cell transistor.

9. The apparatus of claim 1, wherein the SiGe layer sandwiched between the active region and the STI region is on a first surface of the active region and a second surface of the second source/drain region on the one side and on a third surface of the STI region on the other side.

10. The apparatus of claim 1, wherein
the active region includes a pillar-shaped active region, and
a side surface of the pillar-shaped active region is covered by the SiGe layer, the side surface facing the STI region with the SiGe layer therebetween.

\* \* \* \* \*

UNITED STATES PATENT AND TRADEMARK OFFICE
CERTIFICATE OF CORRECTION

| | |
|---|---|
| PATENT NO. | : 12,096,612 B2 |
| APPLICATION NO. | : 17/369899 |
| DATED | : September 17, 2024 |
| INVENTOR(S) | : Tomohiko Kudo |

It is certified that error appears in the above-identified patent and that said Letters Patent is hereby corrected as shown below:

In the Claims

| | Reads | Should Read |
|---|---|---|
| Column 5, Line 35 | "the active region and the second cell contact plug." | --the active region and the cell contact plug.-- |

Signed and Sealed this
Twelfth Day of November, 2024

Katherine Kelly Vidal
*Director of the United States Patent and Trademark Office*